United States Patent

Mock

Patent Number: 5,828,678
Date of Patent: Oct. 27, 1998

[54] DIGITAL AUDIO RESOLVING APPARATUS AND METHOD

[75] Inventor: Jeffrey C. Mock, San Francisco, Calif.

[73] Assignee: Avid Technologies, Inc., Tewksbury, Mass.

[21] Appl. No.: 635,234

[22] Filed: Apr. 12, 1996

[51] Int. Cl.⁶ .............................. G06F 11/00; H03M 13/00
[52] U.S. Cl. ............................................ 371/62; 371/48
[58] Field of Search .............................. 371/62, 57.2, 61, 371/48; 327/159, 147

[56] References Cited

U.S. PATENT DOCUMENTS

| | | | |
|---|---|---|---|
| 4,855,683 | 8/1989 | Troudet et al. | 327/159 |
| 4,916,403 | 4/1990 | Sudoh et al. | 327/159 |
| 4,975,651 | 12/1990 | Hagiwara | 327/147 |
| 5,317,283 | 5/1994 | Korhonen | 331/1 A |
| 5,459,435 | 10/1995 | Taki | 331/1 A |

FOREIGN PATENT DOCUMENTS

0 595 013 A2   5/1994   European Pat. Off. ........ H03L 7/099

OTHER PUBLICATIONS

International Search Report for for PCT/US97/06488, filed Apr. 11, 1997.
*Digital Phase–Locked Loop with Jitter Bounded*, S.M. Walters et al., IEEE Transactions on Circuits and Systems 36 (1989) Jul. No. 7, pp. 980–987.

*Primary Examiner*—Phung M. Chung
*Attorney, Agent, or Firm*—Mintz, Levin, Ferris, Conn, Glovsky and Popeo, P.C.

[57] ABSTRACT

A resolving system for providing an output clock signal having an output clock frequency that is a predetermined rational multiple of a clock frequency of an input signal to the resolving system. In one embodiment, the resolving system includes a first counter that counts clock pulses of the input clock signal to provide a first value, a second counter that counts clock pulses of the output clock signal to provide a second value, a processor that computes a difference between a ratio of the second and first values with the predetermined rational multiple and generates an error signal based on the difference, and a direct digital synthesis unit that receives the error signal, and based on the error signal generates the output clock signal. In another embodiment, the resolving system, in the absence of an input signal, controls the direct digital synthesis unit to generate the output clock signal at a predetermined frequency.

18 Claims, 6 Drawing Sheets

DIGITAL AUDIO RESOLVING APPARATUS AND METHOD

BACKGROUND OF THE INVENTION

1. Field of the Invention

The present invention relates generally to digital audio editing systems, and more particularly, to a method and apparatus for deriving a sample rate for a digital audio signal from a film or video source.

2. Discussion of the Related Art

In modern audio/video post-production environments, digital audio editing systems are used in conjunction with film and video editing systems. Typically, a video reference clock, derived from a film or video source, serves as a master time reference for a video signal and for a corresponding analog audio signal to maintain proper synchronization between the video signal and the analog audio signal in the film.

Digital audio editing equipment uses a sample clock having a sample rate to sample the analog audio signal to produce a digital audio signal for editing. The frequency of the sample clock is typically different than the frequency of the video reference clock. To maintain synchronization between the digital audio signal and the associated video signal in the film, the sample clock of the digital audio system is typically derived from the video reference clock such that a precise ratio between the number of video reference clock pulses and the number of audio sample clock pulses in a given time period is maintained. If the sample clock was generated independently from the video reference clock in the audio editing system, then the sample clock would inevitably drift with respect to the video reference signal causing a loss of synchronization. This loss of synchronization between the sample clock and the video reference signal results in degradation of the resulting audio/visual product.

In order to produce quality output audio signals, digital audio editing systems require that all clocks, including the sample clock, have very low jitter. Any temporal aberrations in clock signals used in analog-to-digital or digital-to-analog converters of the digital editing system cause distortion in the output audio signal. The digital audio editing system clock signals must also be continuous and free of any anomalous clock periods that might introduce clicks or pops in the output audio signal.

The process of deriving a clock signal that is a rational multiple of another clock signal is commonly referred to as resolving, and a resolving ratio (M/N) is defined as the desired output frequency divided by the input or reference frequency. The resolving ratio for audio editing systems cannot be rounded to a decimal estimate, as it is important that the precise rational ratio be maintained. A decimal estimation of the resolving ratio ultimately shows up as drift in the derived clock signal.

In a typical digital audio editing system, a clock signal (identified as 256 Fs) having a clock rate that is 256 times a sample rate (Fs) of 44.1 kHz is derived from the horizontal frequency (H-rate) of a video signal. The National Television Standards Committee (NTSC) has established a standard H-rate for color video signals of 4.5 MHz/286. The corresponding resolving ratio M/N for deriving the 256 Fs clock for the example above is 448448/625 and the frequency of the 256 Fs clock signal is approximately 11.29 MHz.

Resolving systems of the prior art typically use an analog phase-locked loop (PLL), in the resolving circuit. A phase-locked loop is a circuit that multiplies the frequency of an input clock by an integer. A block diagram of a typical phase-locked loop 10 is shown in FIG. 1. The phase locked loop 10 of FIG. 1 includes a phase comparator 12, a low pass filter 26, a voltage controlled oscillator (VCO) 14 and a divide by M circuit 16. The phase-locked loop circuit 10 multiplies an input signal by an integer M to provide an output signal having a frequency that is M times the frequency of the input signal.

The phase-locked loop 10 operates as follows. The phase comparator 12 has a reference input 20 for receiving an input reference signal to be multiplied, has a second input 22 that receives the output signal of the phase-locked loop divided by the integer M, and has an output 24 that provides an output error signal. The phase comparator is typically an analog circuit that generates the output error signal such that a voltage of the output error signal is proportional to a phase difference between the two input signals of the phase comparator. The output error signal in a typical phase-locked loop has a positive voltage if the phase of the reference signal is ahead of the phase of the divided output signal and a negative voltage if the phase of the reference signal is behind the phase of the divided output signal.

The output error signal is low pass filtered in filter 26 and provided as a control signal to a control input 30 of the voltage controlled oscillator 14. The voltage controlled oscillator has an output 28 that provides the output signal of the phase-locked loop at a frequency that is a function of the voltage of the control signal from the filter 26 received at the control input 30. The output error signal controls the voltage controlled oscillator such that the output signal has a frequency that is precisely M times the frequency of the reference signal. The output signal is divided by the integer M in a divide by M circuit 16 to provide the second input signal to the phase comparator 12.

In a resolving application, the input signal to the phase-locked loop is the video reference signal, and the integer M is the numerator of the resolving ratio M/N. A second divider (not shown) is used at the output of the phase-locked loop to divide the frequency of the output signal by the denominator N of the resolving ratio to provide the desired output signal of the resolving system.

The operation of analog phase-locked loops is well known to those skilled in the art, and analog phase-locked loops are used in all known commercially available resolving products.

The use of analog phase-locked loops in digital audio resolving applications is undesirable for a number of reasons including: (1) a high quality analog phase-locked loop is relatively expensive to implement; (2) a phase-locked loop operates over a relatively narrow frequency range limited by the constraints of the analog design; (3) a resolving system that operates over a wide frequency range typically requires several phase-locked loops to cover all the desired operating modes of the resolving system; (4) the resolving ratios used in professional audio applications are rather unique, and it is impractical to build a single phase-locked loop that can provide the necessary multiplication factors, thus requiring two or more phase-locked loops, connected in series, to provide the necessary multiplication; (5) in an analog phase-locked loop design, it is usually necessary to trade off the lock-up time of the phase-locked loop against the jitter performance of the phase-locked loop; and (6) an analog phase-locked loop is inconvenient in a system that would otherwise be a fully digital system.

One prior art resolving system, SMPTE Slave Driver (hereafter referred to as SSD) manufactured by Digidesign, Palo Alto, Calif., a division of Avid Technology Inc., uses a hybrid digital/analog system to overcome some of the problems described above. The hybrid system includes a coarse digital phase-locked loop which produces an output clock signal at the desired frequency, but with very poor clock quality (i.e. excessive jitter). The SSD system also includes an analog phase-locked loop that receives the output of the digital phase-locked loop and generates an output clock signal having the desired frequency and clock characteristics.

A block diagram of the resolving circuitry of the SSD system is shown in FIG. 2. The resolving circuitry includes a microprocessor 210, two event counters 212, 214, a numerically controlled oscillator (NCO) 216, an analog phase-locked loop (PLL) module 218, and a divider 220. The system of FIG. 2 operates as follows. An input clock to be resolved is received after buffering by event counter 214. The pulses of the input clock are counted by the event counter 214 and the result is periodically provided to the microprocessor 210. The NCO is configured as an oscillator such that the most significant bit of the NCO provides an output signal at a desired audio sample rate but with undesirable clock quality (i.e., excessive jitter). The precise output frequency of the NCO is controlled by an error signal received from the microprocessor 210.

The output of the NCO 216 is coupled to the analog phase-locked loop module 218 which functions as a conventional phase-locked loop as previously described with reference to FIG. 1. The analog PLL 218 multiplies the NCO output signal by a factor of 256 and provides a low jitter output clock signal at the desired frequency at an output 222 of the resolving circuit.

The output of the analog PLL 218 is also provided to divider 220 having a divide ratio proportional to the samples per frame ratio of the resolving system. The output of the divider 220 is a 160 pulse per frame clock. The output of the divider is coupled to an input of event counter 212 which includes an internal divide by two circuit. The event counter 212 counts the pulses of the clock signal from the divider 220, divides the result by two and provides the divided result to the microprocessor 210.

The microprocessor calculates a difference count equal to a difference between the values received from the event counters, and based on this difference, generates an error signal to modify the frequency of the NCO to reduce the difference count of the event counters.

Although the SSD system overcomes many of the deficiencies of conventional analog phase-locked loops, the system does include an analog phase-locked loop, and has limitations as a result. Specifically, the lock-up time of the SSD system is relatively slow (approximately 10 seconds), the system requires analog and digital circuitry, and the system lacks flexibility to provide quality output signals for a variety of input signals.

An object of the present invention is to provide a resolving system without an analog phase-locked loop to overcome the associated problems of analog phase-locked loops of the prior art described above. Further, it is an object of the present invention to provide a resolving system having higher quality output clock signals than in systems of the prior art.

SUMMARY OF THE INVENTION

Embodiments of the present invention overcome limitations of the prior art resolving systems described above. Specifically, embodiments of the present invention provide a resolving system that can be implemented using all digital circuitry, provide extremely low jitter output signals, and achieve fast lock-up times to an input signal to be resolved.

In one embodiment of the present invention, a resolving system provides an output clock signal having an output clock frequency that is a predetermined rational multiple of an input clock frequency of an input signal to the resolving system. The resolving system includes a first counter that counts clock pulses of the input clock signal to provide a first value, a second counter that counts clock pulses of the output clock signal to provide a second value, a processor that computes a difference between a ratio of the first and second values with the predetermined rational multiple and generates an error signal based on the difference, and a direct digital synthesis unit that receives the error signal, and based on the error signal generates the output clock signal.

In a preferred embodiment of the present invention, the resolving system has a plurality of inputs for receiving a plurality of input signals and further includes a switching unit for selecting one of the plurality of input signals as the input signal to the input counter. In the preferred embodiment, the resolving system further includes a receiver that detects the absence of the input signal and provides a control signal to the processor. The processor further includes means for setting the output clock frequency to a predetermined value upon detection of the absence of the input signal. The processor also includes means for setting the output clock frequency to a predetermined value for a predetermined period of time when an input signal is initially received by the resolving system.

In yet another embodiment of the present invention, a resolving system is provided having an input to receive an input clock signal having an input clock frequency and a first output that provides a first output clock signal having an output clock frequency that is a predetermined rational multiple of the input clock frequency. The resolving system includes a first counter that counts clock pulses of the input clock signal and provides a first signal having a first value corresponding to a number of clock pulses of the input signal received by the counter, a second counter that counts clock pulses of the first output clock signal and provides a second signal having a second value corresponding to a number of clock pulses of the first output clock signal, means for comparing a ratio between the first value and the second value with the predetermined rational multiple to obtain a comparison result, and means for adjusting the frequency of the output signal based upon the comparison result.

In still another embodiment of the present invention, in a resolving system having an input for receiving an input clock signal having an input clock frequency and an output for providing an output clock signal having an output clock frequency, a method is provided for maintaining the output clock frequency at a predetermined rational multiple of the input clock frequency. The method includes steps of counting pulses of the input clock signal for a predetermined period of time, a number of pulses of the input clock signal counted over the predetermined period of time corresponding to a first value, counting pulses of the output clock signal for the predetermined period of time, a number of pulses of the output clock signal counted over the predetermined period of time corresponding to a second value, dividing the second value by the first value to obtain a ratio, comparing the ratio with the predetermined rational multiple to obtain an error value, and adjusting the output clock frequency based on the error value.

DESCRIPTION OF THE FIGURES

For a better understanding of the present invention, reference is made to the accompanying drawings which are incorporated herein by reference and in which.

DETAILED DESCRIPTION

Figure 3:
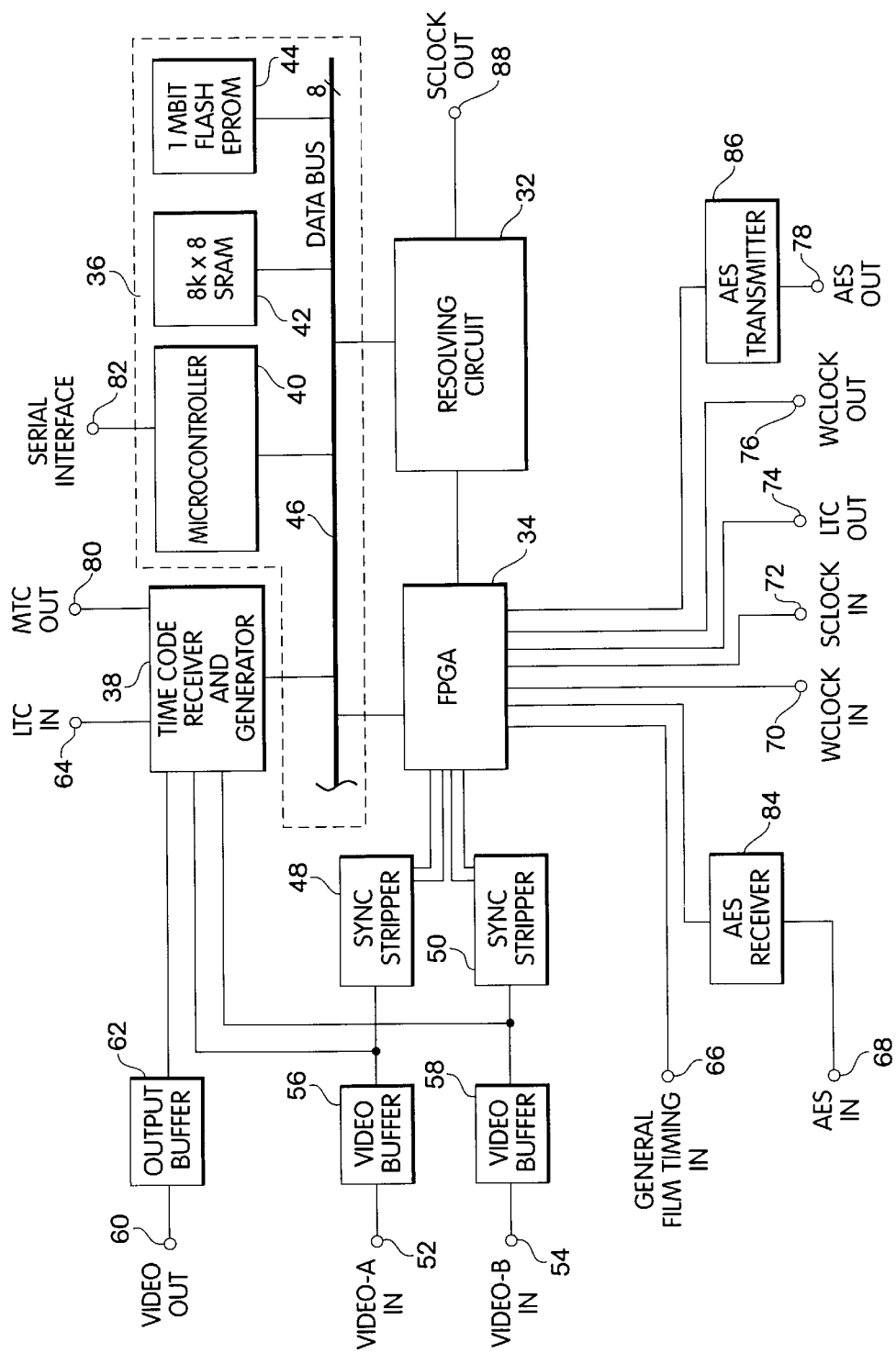
FIG. 3 is a schematic diagram of a resolving system in accordance with one embodiment of the present invention.

A block diagram of a digital audio resolving system 30 in accordance with one embodiment of the present invention is shown in FIG. 3. The primary function of the resolving system 30 is to provide a 256 Fs sample clock signal and a 160 Fr clock signal both of which are derived from one of several input reference sources. The 256 Fs signal, as in systems of the prior art, has a frequency that is 256 times the sampling rate of a digital audio system. The 160 Fr signal has a frequency that is 160 times the frame rate of the reference video signal. The resolving system shown in FIG. 3 consists of four major functional areas including a resolving circuit 32, a field programmable gate array (FPGA) 34, a microcontroller subsystem 36, and a time code receiver and generator 38. These four major functional areas are coupled together by a data bus.46 of the microcontroller subsystem.

In addition to components contained within the four major functional areas described above, the resolving system 30 further includes two video input terminals 52 and 54, two video buffers 56 and 58 and two synch strippers 48 and 50. The video input terminals 52 and 54 are each connected to an input of one of the video buffers 56 and 58. An output of each of the video buffers 56 and 58 is connected to an input of one of the sync strippers 48 and 50, and an output of each video buffer is also connected to an input of the time code receiving and generating subsystem 38. The video buffers 56 and 58 provide buffering for video signals received at the video input terminals 52 and 54. Each of the sync strippers 48 and 50 derive high quality horizontal sync and vertical sync signals from the incoming video signals, and provide the horizontal and vertical sync signals to the field programmable gate array 34 as potential resolving sources for the resolving system.

A video output terminal 60 is also connected to the time code receiver and generator 38 through an output buffer 62. The output buffer 62 provides buffering and amplification of an output video signal of the resolving system 30.

The resolving system 30 includes several other input and output terminals as shown in FIG. 3. A Longitudinal Time Code (LTC) input terminal 64 is connected to an input of the time code receiver and generator 38. An LTC output terminal 74 is connected to the FPGA 34. Also connected to the FPGA are a word synch input terminal 70, a word synch output terminal 76, a sample clock input terminal 72, a general film timing input terminal 66 and American Engineering Society (AES) input and output terminals 68 and 78. The general film timing input 66 can receive at one of various rates either a pilot tone signal, a tach signal or a bi-phase signal. The AES input terminal and output terminal are connected to the FPGA 34 through respectively an AES receiver 84 and an AES transmitter 86. A MIDI Time Code (MTC) output terminal 80 is connected to the time code receiving and generating subsystem 38. A serial interface terminal 82 is connected to the microcontroller 40 to enable the microcontroller to communicate with an external processor. The primary output terminal of the resolving system 30 is the sample clock (256 Fs) output terminal 88. Further discussion of the functionality of the inputs and the outputs of the resolving system is included below.

The operation and further description of each of the four primary functional areas, the time code receiver and generator 38, the field programmable gate array 34, the microcontroller subsystem 36 and the resolving circuit 32 of the resolving system 30 is provided below.

Time Code Receiver and Generator

The time code receiver and generator 38 performs several functions related to time code reception and generation. The time code receiver and generator reads an LTC input signal received at the LTC input terminal 64 and provides an output LTC clock signal, based on the received LTC signal, to the FPGA 34. The LTC clock signal is a potential resolving source of the resolving system and is derived from a 14.31818 MHz oscillator included within the time code receiver and generator.

The time code receiver and generator 38 also reads Vertical Interval Time Code (VITC) from a video signal received at one of the video input terminals 52 and 54 of the resolving circuit. The particular video input signal from which VITC is read is selectable by software in the microcontroller subsystem 36. The time code receiver and generator can read VITC from two different scan lines, can search for scan lines containing VITC, can insert VITC information on two scan lines of the outgoing video signal and can optionally insert a "burn-in" window in the output video signal, provided at the video output terminal 60, with human-readable time code.

The time code generator and receiver can also be programmed by the microcontroller 40 to provide an interrupt signal to the microcontroller subsystem through the FPGA 34. The interrupt signal can be provided once per field of the input signal, once per frame and upon the detection by the time code generator and receiver of various error conditions.

The time code receiver and generator 38 also provides an MTC output to the MTC output terminal 80.

In a preferred embodiment of the present invention, the time code receiver and generator is implemented using an SMPTE time code receiver/generator chip, ICS 2008A manufactured by Integrated Circuit Systems, Inc., Valley Forge, Pa. In the preferred embodiment, a Clock oscillator is coupled to the ICS 2008A to provide the 14.31818 MHz clock signal.

Field Programmable Gate Array (FPGA)

The field programmable gate array 34 is a RAM programmable device that implements substantially all of the random logic in the resolving system 30. The field programmable gate array is initially unprogrammed after a power on or a reset of the resolving system. Upon power on or reset, configuration data for the FPGA, stored in the EPROM 44, is loaded by the microcontroller 40 into the FPGA to provide the necessary configuration of the FPGA. Because the FPGA is configured using software, the FPGA is easily modified which allows the resolving system to adapt to new synchronization requirements without manufacturing changes.

Figure 4:
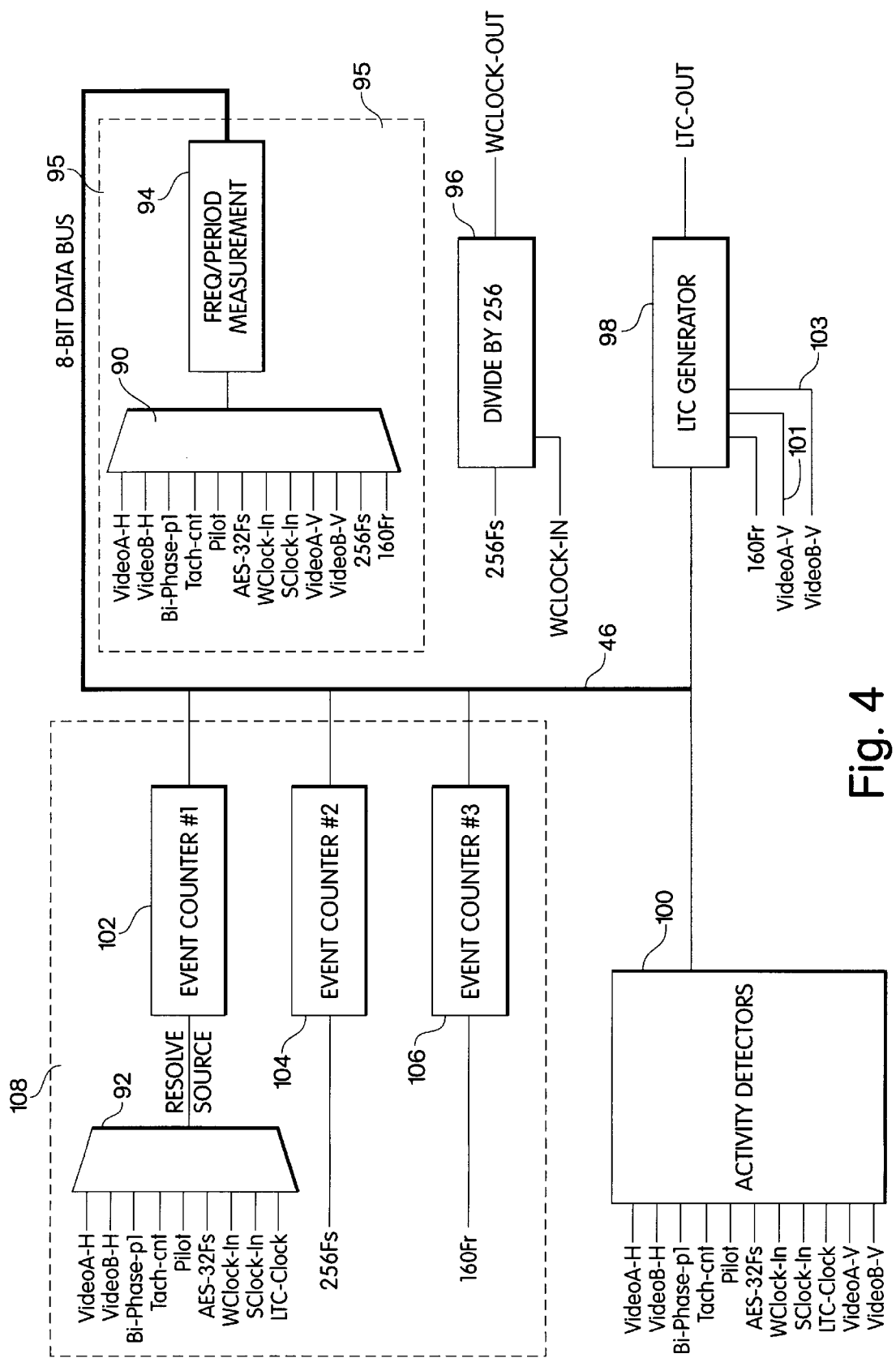
FIG. 4 is a functional block diagram of a field programmable gate array in accordance with one embodiment of the present invention.

A functional block diagram of the field programmable gate array 34 showing the primary functions of the FPGA as configured for the resolving system 30 is shown in FIG. 4.

The FPGA 34 includes an LTC generator 98, an activity detector 100, a frequency/period measurement unit 95, a divide by 256 unit 96 and a resolving unit 108.

The LTC generator 98 provides the LTC output signal at the LTC output terminal 74 of the resolving system. The LTC generator receives the 160 Fr signal from the resolving circuit 32 and the vertical synchronization signals videoA-V 101 and videoB-V 103 generated by the sync-strippers 48 and 50 to generate the LTC output signal.

The activity detector 100 of the FPGA 34 detects the status of input signals at each of input terminals 52, 54, 66, 68, 70, 72 and 64 and reports the status to the microcontroller subsystem 36 over the data bus 46.

The frequency/period measurement unit 95 of the FPGA 34 includes a multiplexer 90 and a frequency/period measurement circuit 94. The multiplexer 90 selects one of several input signals for frequency or period measurement and provides the selected signal to the frequency/period measurement circuit 94. As shown in FIG. 3, the multiplexer 90 receives several signals including VideoA-H, VideoB-H, Bi-Phase-p1, Tach, Pilot, AES, WClock-In, Sclock-In, VideoA-V, VideoB-V, 256 Fs and 160 Fr. The VideoA-H, VideoB-H, VideoA-V and VideoB-V signals are the horizontal and vertical synchronization signals received by the FPGA from the synch strippers 48 and 50. The bi-phase, tach and pilot signals are synchronization signals that can be received at the general film timing input terminal 66. The AES signal is the input AES signal received at the AES input terminal 68 and the 256 Fs and 160 Fr signals are output signals of the resolving circuit 32. The Wclock-In signal is a word synchronization signal that is received at the Wclock-In terminal 70, Sclock-In is a sample clock signal received at input terminal 72. The frequency period/measurement circuit 94 measures the frequency and/or the period of a selected input signal, and sends a signal indicative of the measured parameter to the microcontroller 40 over the data bus 46.

The resolving unit 108 in conjunction with the resolving circuit 32 provides the resolving function of the resolving system 30. The resolving unit 108 includes a resolving multiplexer 92, and three event counters 102, 104 and 106. The resolving multiplexer 92 is used to select one of the input signals shown in FIG. 4 as the resolving or reference source of the resolving system. The function of each of the event counters 102, 104 and 106 is described in more detail below in conjunction with the resolving circuit 32.

In a preferred embodiment of the present invention, the FPGA is implemented using a Xilinx 3042 FPGA, manufactured by Xilinx, Inc. San Jose, Calif.

Microcontroller Subsystem

The microcontroller subsystem 36, as shown in FIG. 3, includes a microcontroller 40, a static Random Access Memory (SRAM) 42, an Erasable/Programmable Memory (EPROM) 42 and an 8 bit data bus 46. The resolving circuit 32, the FPGA 34 and the time code receiver and generator 38 are connected to the microcontroller 40 over the 8 bit data bus 46.

The microcontroller 40 functions as the primary controller of the resolving system 30 and accesses the other components of the resolving system over the data bus 46. The microcontroller is also coupled to the serial interface 82 of the resolving system for providing access to the resolving system 30 from a host computer system.

In a preferred embodiment of the present invention, the microcontroller 40 is a Toshiba MC68HC11E1 microcontroller, the SRAM 40 includes 8k bytes of static RAM, and the EPROM 42 is a one megabit EPROM.

Resolving Circuit

Figure 1:
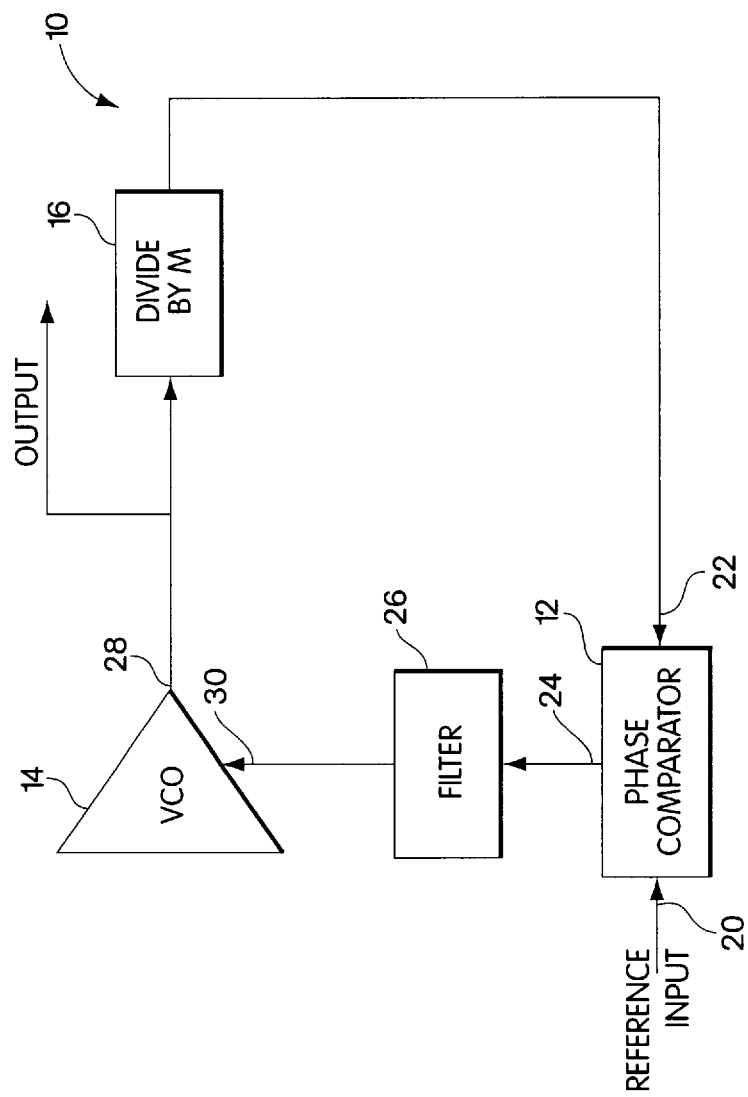
FIG. 1 is a schematic diagram of a phase-locked loop circuit of the prior art.
Figure 5:
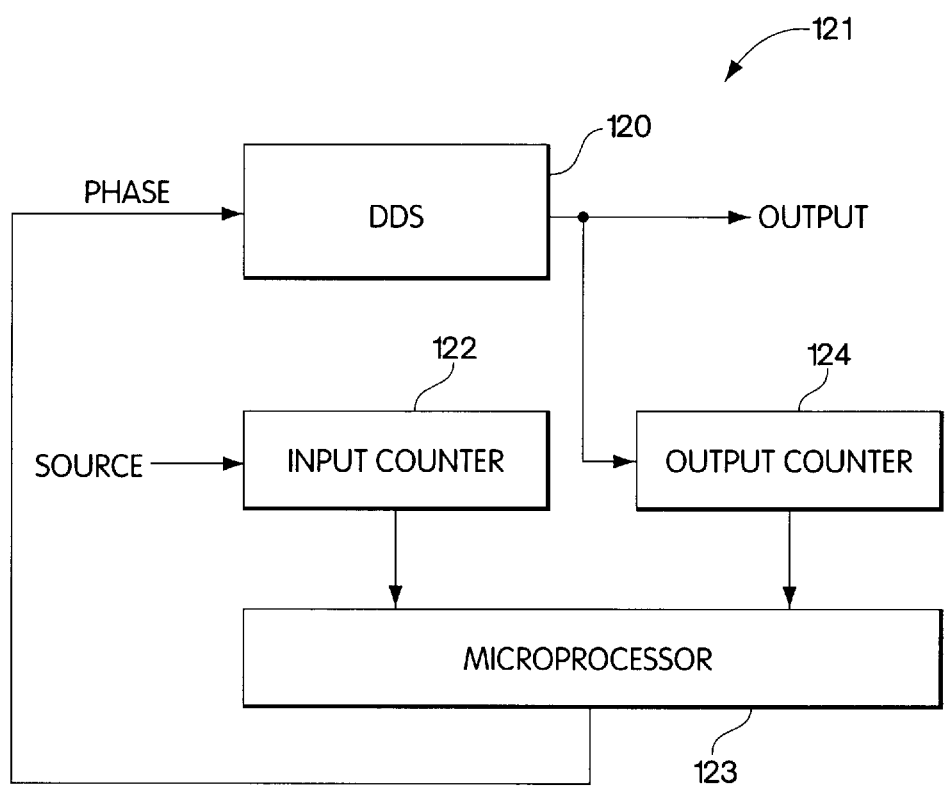
FIG. 5 is a functional block diagram of a resolving system in accordance with one embodiment of the present invention.

FIG. 5 shows a simplified block diagram of a resolving circuit 121 that will be used to demonstrate the high level operation of the resolving function of the resolving system 30 in accordance with one embodiment of the present invention. The resolving circuit 121 performs functions similar to that of the analog phase-locked loop of the prior art shown in FIG. 1, however, the resolving circuit 121 overcomes many of the limitations of the analog phase-locked loop and provides additional functionality and improved performance. The resolving circuit 121 receives a reference signal having a reference frequency and provides an output resolved signal having a frequency that is equal to the frequency of the input signal multiplied by a resolving ratio M/N.

The resolving circuit 121 includes a Direct Digital Synthesis (DDS) circuit 120 having an input that receives a phase signal from a microprocessor 123 and an output that provides the output resolved signal, an input counter 122 that receives the reference signal and provides an output signal to the processor 123, and an output counter 124 that receives the output resolved signal and provides an output signal to the processor 123. The DDS circuit 120, as known to those skilled in the art, uses a Numerically Controlled Oscillator (NCO) to generate a digital approximation of a sine wave at the frequency of the output resolved signal. The precise frequency of the sine wave signal generated by the DDS circuit is controlled by the phase signal received from the microprocessor 123.

The input counter 122 and the output counter 124 respectively count pulses of the reference signal and the output resolved signal. The processor 123 periodically reads the output values of each of the two counters and calculates a ratio of the number of pulses of the reference signal to the number of pulses of the output resolved signal. The ratio calculated by the processor is compared to the desired resolving ratio M/N and the difference between the calculated ratio and the desired ratio is used to generate the phase signal to control the DDS circuit to adjust the frequency of the output resolved signal to be M/N times the frequency of the input reference signal.

Figure 2:
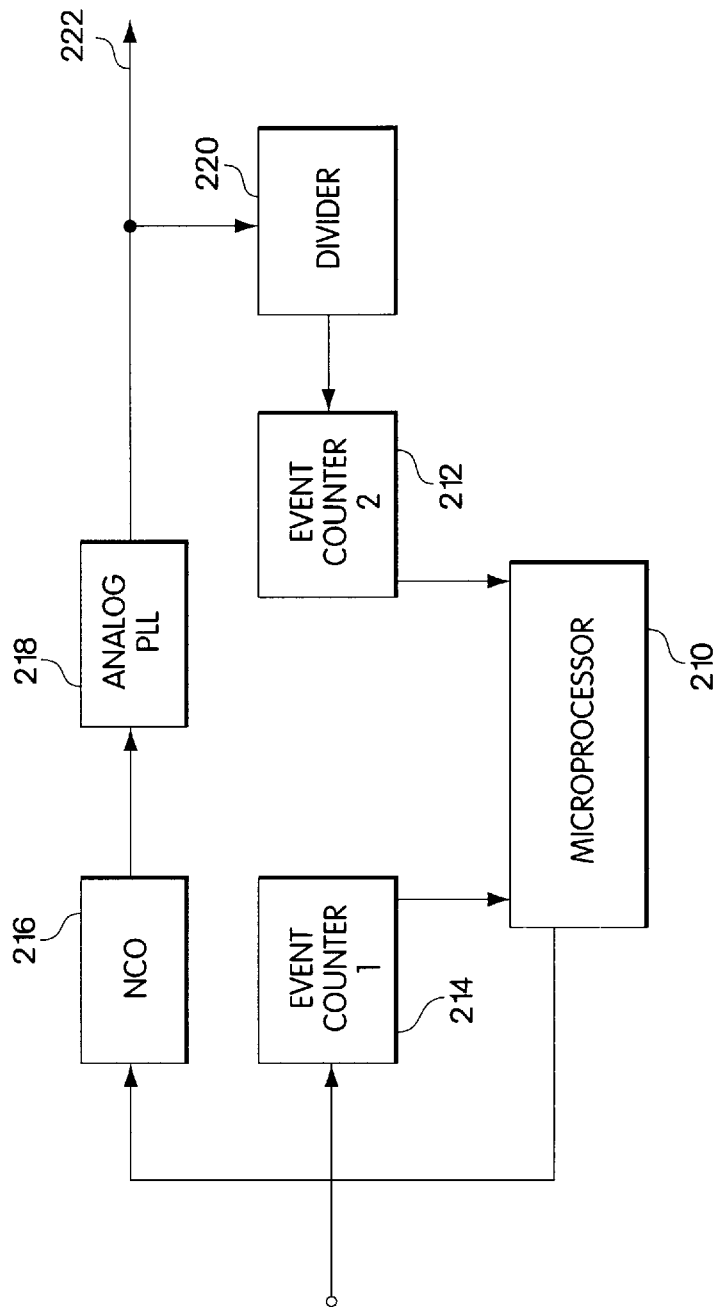
FIG. 2 is a block diagram of a resolving system of the prior art.
Figure 6:
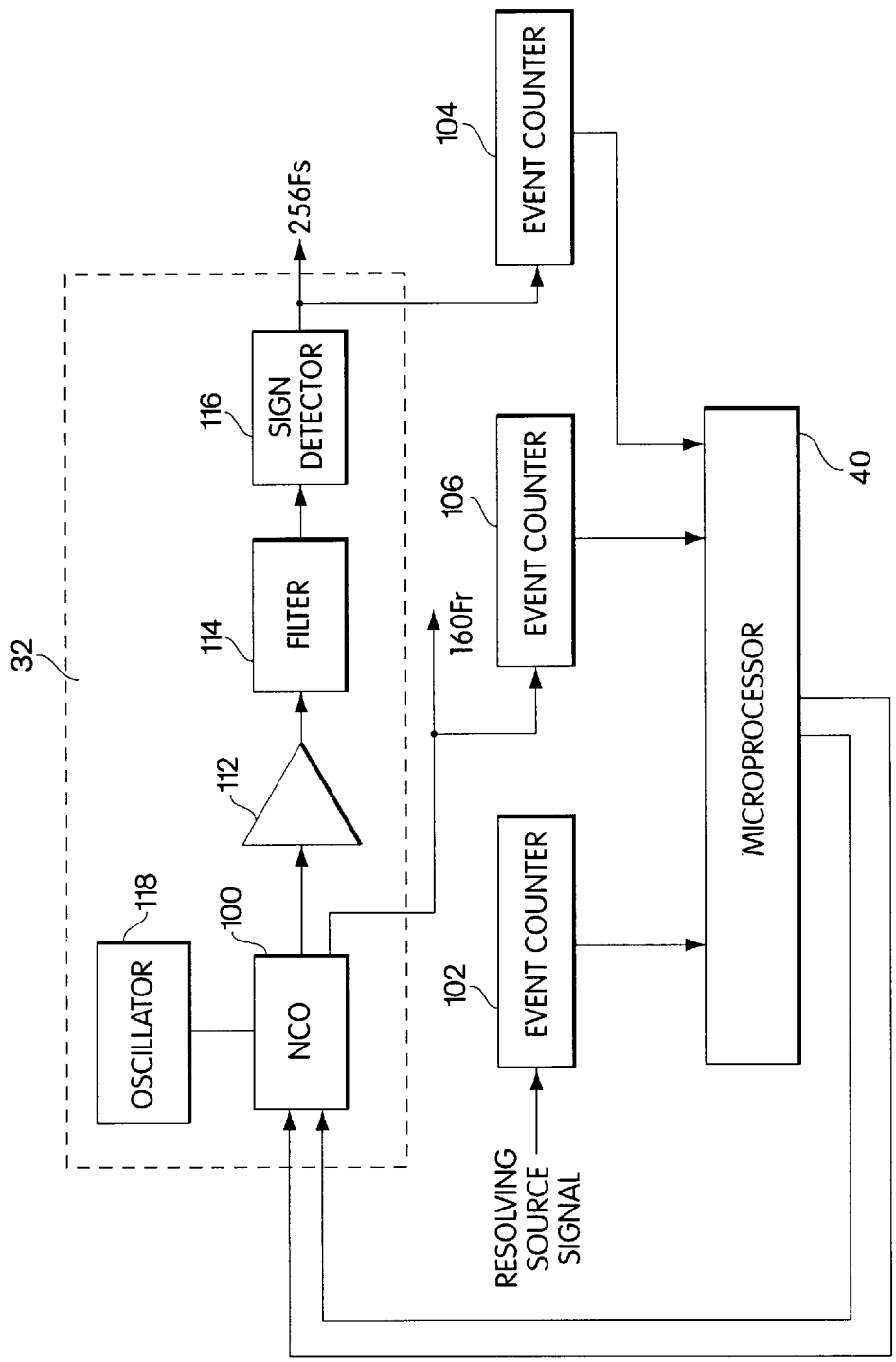
FIG. 6 is a schematic diagram of a resolving circuit in accordance with one embodiment of the present invention.

A preferred embodiment of the resolving function shown in FIG. 5 is implemented in the resolving system 30 of FIG. 2 using the resolving circuit 32, the microcontroller 40 and the event counters 102,104, and 106 of the FPGA 34 as shown in FIG. 6. The function of the DDS circuit 120, shown in FIG. 5, is performed by the resolving circuit 32. The function of the input counter 122 and the output counter 124 are respectively performed by the event counters 102 and 104 of the FPGA 34 and the microcontroller 40 performs the functions of the processor 123.

The resolving circuit 32 derives the 256 Fs sampling clock and also derives the 160 Fr clock signal used in the LTC generator of the FPGA to produce the output LTC signal. As discussed above and shown in FIG. 3, the signal used as the source for deriving the 256 Fs sampling clock and the 160 Fr clock signal can be selected from among one of several input signals by the resolving multiplexer 92. The event counter 102 is used to count clock pulses of the resolving source signal, the event counter 104 is used to count pulses of the 256 Fs sampling clock and the event counter 106 is used to count pulses of the 160 Fr clock signal. In the illustrative embodiment of the present invention, each of the bit counters are implemented in the FPGA as 8 bit counters.

The microcontroller 40 maintains the count of each of the event counters 102, 104 and 106 and updates the count upon receipt of an interrupt signal by one of the event counters. In a preferred embodiment of the present invention, this interrupt can be programmed to occur at one of eight different programmable rates selectable based on the stability of the resolving source signal, and an interrupt signal also occurs upon overflow of event counter 104. Event counter 104 will overflow prior to event counters 102 or 106 as the 256 Fs signal has a higher pulse rate than any of the resolving sources or of the 160 Fr clock signal.

After updating the count of each of the counters, the microcontroller calculates two error terms, one corresponding to a difference between the actual output frequency of the 256 Fs signal and the desired output frequency based on the resolving source selected and the other error term corresponding to a difference between a desired output frequency of the 160 Fr clock signal and the actual frequency of the 160 Fr clock signal. Based on the calculated error terms, the microcontroller 40 sends error signals to the resolving circuit 32 to control the resolving circuit to modify the frequency of the 256 Fs signal and the 160 Fr signal.

As shown FIG. 6, the resolving circuit 32 includes several components including a Numerically Controlled Oscillator (NCO) 100, a digital to analog converter 112, a filter 114, a sign detector 116 and an oscillator 118. The operation of NCOs are well known to those skilled in the art. NCOs generate a digital approximation of a sine wave at a selectable frequency. In a preferred embodiment of the present invention, the NCO is the STEL-1178A NCO manufactured by Stanford Telecom of Palo Alto, Calif. The STEL-1178A NCO includes two independent 32 bit NCOs in a single package capable of operating at speeds up to 80 MHz. One of the NCOs is used to derive the 256 Fs signal and the other NCO is used to derive the 160 Fr signal.

As stated above, the NCO in a preferred embodiment of the present invention is capable of operating at speeds up to 80 MHz. The actual operating speed is determined by the frequency of the oscillator 118. As understood by those skilled in the art, the operational speed of the NCO determines the minimum frequency increment by which the frequency of the output signal of the NCO can be adjusted. In the illustrative embodiment, the oscillator 118 is configured to operate at 78.6432 MHz. This frequency is accurate to greater than 10 ppm in order to meet American Engineering Society requirements for output clock signals. In order for the AES requirements to be met over the lifetime of the resolving system, the tolerance of the oscillator clock frequency is selected to be greater than 10 ppm. This can be achieved relatively inexpensively by using a standard 50 ppm oscillator module, measuring the actual frequency of the oscillator, and storing an offset in the EPROM 44 of the microcontroller 40. The offset can then be used by the NCO to alter the divide ratios of clocks generated within the NCO.

The frequency of the oscillator 118 is selected as 78.6834 MHz for two reasons. First, the oscillator 118 is also used as an oscillator for the microcontroller 40. For use in the microcontroller, the 78.6432 MHz signal is divided by eight to create a 9.8304 MHz clock. The use of a 9.8304 MHz clock in the microcontroller allows the serial interface of the microcontroller to operate at a convenient 9600 baud rate. Second, NCOs generate their best jitter performance when the generated frequency from the NCO shares no common multiples with the oscillator frequency. The reasons for this jitter performance are described in more detail in Stanford Telecom's DDS' Handbook, published Stanford Telecom of Palo Alto, Calif., which is incorporated herein by reference. The minimum frequency increment of the NCO output signal, based on the use of the 78.6432 MHz oscillator and a 32 bit output signal of the NCO, is 0.0185 Hz.

As stated above, one 32 bit digital output of the dual output NCO 100 is used to derive the 256 Fs signal and the other 32 bit digital output of the NCO is used to generate the 160 Fr signal. The 256 Fs signal is derived from the 10 least significant bits of the 32 bit output. The 160 Fr signal is generated directly from the most significant bit of the 32 bit output of the other NCO. The jitter performance of the 160 Fr signal is not as critical as that of the 256 Fs signal. The 160 Fr signal derived directly from the most significant bit of the NCO output, will have a maximum jitter corresponding to one clock period of the oscillator 118 or approximately 12.5 nanoseconds.

The 10 bit digital signal used to derive the 256 Fs signal is input to the digital-to-analog converter (DAC) 112. The digital to analog converter converts the digital representation of a sine wave output by the NCO 100 into a sine wave at the output frequency of the NCO. In a preferred embodiment, the DAC 112 is an AD9720 D/A Converter manufactured by Analog Devices Inc. of Norwood, Mass.

The sine wave output by the DAC 112 is filtered in the filter 114. The filter 114 is a 5 pole low pass Cauer eliptic filter having a cut-off frequency of approximately 20 MHz. The output of the filter 114 is input to the sign detector 116. The filtered sine wave signal is amplified and clipped in the sign detector 116 to generate a TTL square wave having a frequency of 256 Fs. The output of the sign detector is coupled to the output terminal 88 of the resolving system 30 to provide the output resolving signal and is also coupled to the input of the event counter 104 for error correction as described above.

The 160 Fr signal is generated directly from one of the outputs of the NCO 100 as described above. The 160 Fr signal is input to the LTC generator 98 of the FPGA 34 to produce the LTC output signal, and is also input to event counter 106 of the FPGA.

In conventional resolving systems using analog phase-locked loops, the resolving system is determined to be "locked" by measuring the error signal of the phase detector in the phase-locked loop. When the integral of the error signal approaches zero, the system is defined as locked. When this occurs, the resolved signal is a precise integer ratio of the input signal. Prior to locking, the output signal is not related to the input signal by the precise integer ratio. The period of time between initialization of the system and locking is defined as the lock-up time of the system.

In embodiments of the present invention described above, the phase-locked loop of the resolving system is implemented using all digital technology, and the lock-up time of the system is relatively quick. While it is generally desirable to reduce the lock-up time of a resolving system, problems may occur when the lock-up occurs too quickly. An example of such a problem occurs when an input LTC signal, generated from a video tape recorder (VTR), is used as the resolving source of the resolving system. The input LTC signal becomes active upon the activation of the "play" button on the VTR. The VTR is a mechanical device and typically requires a spin-up time of approximately 300 milliseconds from activation of the play button before achieving full speed. During the spin-up time, the LTC clock rate from the VTR is stewing from DC to 29.97 frames per second.

In embodiments of the present invention, the resolving system can become locked to the input LTC signal in a few milliseconds, well before the VTR has achieved full speed. Under this scenario, the output sample rate of the resolving system will first slew down to meet the LTC clock rate that is slewing up, then the output sample rate will slew up in frequency along with the LTC clock rate. This slewing of the output sample rate of the resolving system is undesirable. In a preferred embodiment of the present invention, the lock-up time of the resolving system is selectable based upon software loaded within the microprocessor 40. The lock-up time selected by the microprocessor is dependent on parameters of the selected resolving source. For an LTC input signal, which generally represents the worst case scenario, the microcontroller 40 is programmed to receive 15 frames of the input LTC signal before attempting to lock the output sample clock to the input LTC signal. Prior to locking, the microcontroller controls the resolving circuit 32 to generate the 256 Fs and 160 Fr signals independent of the input LTC signal.

In a preferred embodiment, the resolving system 30 includes an additional feature for resolving the 256 Fs signal and the 160 Fr signal when the input LTC signal is selected as the resolving source. The incoming time code from the LTC input is monitored once per frame by the microcontroller by interrogating the time code receiver and generator 38. If the time code receiver and generator responds to the interrogation by indicating that the LTC signal has dropped out or is no longer within predetermined tolerances, the microcontroller 40 will disable the resolving process such that the output frequencies of the NCO 112 will remain constant, without error correction, until an indication is received by the microcontroller 40 from the time code receiver and generator 38 that the received LTC signal is again within predetermined tolerances.

Embodiments of the present invention, described above, overcome limitations of prior art resolving systems. Specifically, embodiments of the present invention provide a resolving system that can be implemented using all digital circuitry, provide extremely low jitter output signals, and achieve relatively fast lock-up times to an input signal to be resolved.

Further, embodiments of the present invention provide a resolving system having flexibility to select a resolving source signal from a plurality of input signals having a variety of characteristics. In embodiments of the present invention, the output signal of the resolving system is generated using direct digital synthesis which allows the frequency of the output signal and resolving ratio of the system to be software selectable thus providing additional flexibility to the resolving system.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the claims and the equivalents thereto.

What is claimed is:

1. A resolving system having an input to receive an input clock signal having an input clock frequency and a first output that provides a first output clock signal having a first output clock frequency that is a first predetermined rational multiple of the input clock frequency, the resolving system comprising:
   a first counter that counts clock pulses of the input clock signal, the first counter having an input coupled to the input of the resolving system to receive the input clock signal and an output that provides a first signal having a first value corresponding to a number of clock pulses of the input signal received by the first counter;
   a second counter that counts clock pulses of the first output clock signal, the second counter having an input coupled to the first output of the resolving system to receive the first output clock signal and an output that provides a second signal having a second value corresponding to a number of clock pulses of the first output clock signal;
   a processor, coupled to the outputs of the first and second counters to receive the first and second signals, the processor including means for generating a first error signal corresponding to a difference between a ratio of the second value and the first value with the first predetermined rational multiple; and
   a direct digital synthesis unit having an input coupled to the processor to receive the first error signal and having an output coupled to the output of the resolving system to provide the output clock signal, the output clock frequency being controlled by the error signal.

2. The resolving system of claim 1, wherein the input of the resolving system is one of a plurality of inputs and wherein the resolving system further comprises a switching unit, coupled between the first counter and the plurality of inputs of the resolving system, the switching unit receiving a plurality of input signals from the plurality of inputs, the switching unit having a control input that receives a control signal for selecting one of the plurality of input signals as the input signal to the first counter.

3. The resolving system of claim 2, further comprising:
   a second output that provides a second output clock signal having a second output clock frequency that is a second predetermined rational multiple of the input clock signal;
   a third counter that counts clock pulses of the second output clock signal, the third counter having an input coupled to the second output of the resolving system to receive the second output clock signal and an output that provides a third signal having a third value corresponding to a number of clock pulses of the second output clock signal; and
   wherein the processor is coupled to the output of the third counter to receive the third signal, and wherein the processor includes means for generating a second error signal corresponding to a difference between a ratio of the third value and the first value and the second predetermined rational multiple.

4. The resolving system of claim 3, further comprising:
   a receiver circuit having an input coupled to one of the plurality of inputs of the resolving system to receive one of the plurality of input signals, a first output coupled to the switching unit to provide the one of the plurality of input signals, and a second output coupled to the processor to provide a control signal, the receiver circuit detecting the presence of the one of the plurality of input signals and providing the control signal to the processor to indicate whether the one of the plurality of input signals is present; and
   wherein the processor further includes means for controlling the direct digital synthesis unit to set the first and second output clock frequencies to predetermined frequencies when the control signal from the receiver circuit indicates that the one of the plurality of input signals is not present.

5. The resolving system of claim 4, wherein the processor further includes means for controlling the direct digital synthesis unit to set the first and second output clock frequencies to predetermined frequencies for a predetermined period of time.

6. The resolving system of claim 5, wherein the direct digital synthesis unit includes:

a numerically controlled oscillator having first and second inputs coupled to the processor to respectively receive the first and second error signals, a first output and second output coupled to the second output of the direct digital synthesis unit, the numerically controlled oscillator providing at the first and second outputs first and second digital representations of a sine wave having frequencies respectively controlled by the first and second error signals; and a digital-to-analog converter having an input coupled to one of the outputs of the numerically controlled oscillator, and an output that provides a sine wave signal corresponding to the digital representation of a sine wave received from the numerically controlled oscillator.

7. The resolving system of claim 6, wherein the direct digital synthesis unit further includes:

a filter having an input coupled to the output of the digital-to-analog converter that filters the sine wave signal and provides a filtered sine wave signal; and a sign detector coupled between the output of the filter and the first output of the direct digital synthesis unit, the sign detector filtering and amplifying the filtered sine wave signal to provide the first output clock signal.

8. The resolving system of claim 1, further comprising:

a second output that provides a second output clock signal having a second output clock frequency that is a second predetermined rational multiple of the input clock signal;

a third counter that counts clock pulses of the second output clock signal, the third counter having an input coupled to the second output of the resolving system to receive the second output clock signal and an output that provides a third signal having a third value corresponding to a number of clock pulses of the second output clock signal; and wherein the processor is coupled to the output of the third counter to receive the third signal, and wherein the processor includes means for generating a second error signal corresponding to a difference between a ratio of the third value and the first value and the predetermined rational multiple.

9. The resolving system of claim 1, further comprising:

a receiver circuit having an input coupled to the input of the resolving system to receive the input signal, a first output coupled to first counter to provide the input signal, and a second output coupled to the processor to provide a control signal, the receiver circuit detecting the presence of the input signal and providing the control signal to the processor to indicate whether the input signal is present; and wherein the processor further includes means for controlling the direct digital synthesis unit to set the first output clock frequency to provide a predetermined frequency when the control signal from the receiver circuit indicates that the input signal is not present.

10. The resolving system of claim 9, wherein the processor further includes means for controlling the direct digital synthesis unit to set the output clock frequency to a predetermined frequency for a predetermined period of time.

11. The resolving system of claim 1, wherein the processor further includes means for controlling the direct digital synthesis unit to set the output clock frequency to a predetermined frequency for a predetermined period of time.

12. The resolving system of claim 1, wherein the direct digital synthesis unit includes:

a numerically controlled oscillator having an input coupled to the processor to receive the first error signal, and an output that provides a digital representation of a sine wave having a frequency controlled by the first error signal;

a digital-to-analog converter having an input coupled to the output of the numerically controlled oscillator, and an output that provides a sine wave signal corresponding to the digital representation of a sine wave received from the numerically controlled oscillator.

13. The resolving system of claim 12, wherein the direct digital synthesis unit further includes:

a filter having an input coupled to the output of the digital-to-analog converter that filters the sine wave signal and provides a filtered sine wave signal; and a sign detector coupled between the output of the filter and the first output of the direct digital synthesis unit, the sign detector filtering and amplifying the filtered sine wave signal to provide the first output clock signal.

14. A resolving system having an input to receive an input clock signal having an input clock frequency and a first output that provides an output clock signal having an output clock frequency that is a predetermined rational multiple of the input clock frequency, the resolving system comprising:

a first counter that counts clock pulses of the input clock signal, the first counter having an input coupled to the input of the resolving system to receive the input clock signal and an output that provides a first signal having a first value corresponding to a number of clock pulses of the input signal received by the first counter;

a second counter that counts clock pulses of the first output clock signal, the second counter having an input coupled to the first output of the resolving system to receive the first output clock signal and an output that provides a second signal having a second value corresponding to a number of clock pulses of the first output clock signal;

means for comparing a ratio between the second value and the first value with the first predetermined rational multiple to obtain a comparison result; and means for adjusting the output clock frequency based upon the comparison result.

15. The resolving system of claim 14, further comprising:

means for detecting whether the input signal is present; and means for setting the output clock frequency to a predetermined value upon detection of the absence of the input signal.

16. The resolving system of claim 14, further comprising means for setting the output clock frequency to a predetermined value for a predetermined period of time upon initially receiving the input signal.

17. A resolving system for generating an output clock signal from an input clock signal having an input clock frequency, the output clock signal having an output clock frequency that is a rational multiple of the input clock frequency, the resolving system comprising:

an input to receive the input clock signal;

a first output that provides the output clock signal;

a first counter that counts clock pulses of the input clock signal, the first counter having an input to receive the input clock signal and an output that provides a first signal having a first value corresponding to a number of clock pulses of the input signal received by the first counter;

a second counter that counts clock pulses of the output clock signal, the second counter having an input coupled to the first output of the resolving system to receive the output clock signal and an output that provides a second signal having a second value corresponding to a number of clock pulses of the output clock signal;

a processor, coupled to the outputs of the first and second counters to receive the first and second signals, the processor being adapted to generate a first error signal based on the first value, the second value and the rational multiple;

a direct digital synthesis unit having an input coupled to the processor to receive the first error signal and having an output coupled to the output of the resolving system to provide the output clock signal, the output clock frequency being set by the direct digital synthesis unit based on the first error signal; and a receiver circuit having an input coupled to the input of the resolving system to receive the input signal, a first output coupled to the first counter to provide the input signal, and a second output coupled to the processor to provide a control signal, the receiver circuit being adapted to detect the presence of the input signal and to provide the control signal to the processor to indicate whether the input signal is present;

wherein the processor is adapted to control the direct digital synthesis unit to set the first output clock frequency to provide a predetermined frequency when the control signal from the receiver circuit indicates that the input signal is not present.

18. The resolving system of claim 17, wherein the processor is adapted to control the direct digital synthesis unit to set the output clock signal to a predetermined frequency for a predetermined period of time.

* * * * *